United States Patent
Boyer

(10) Patent No.: US 6,417,110 B1
(45) Date of Patent: Jul. 9, 2002

(54) METHOD FOR CONSTRUCTING HEAT RESISTANT ELECTRODE STRUCTURES ON SILICON SUBSTRATES

(75) Inventor: Leonard L. Boyer, Albuquerque, NM (US)

(73) Assignee: Radiant Technologies INC, Albuquerque, NM (US)

( * ) Notice: Subject to any disclaimer, the term of this patent is extended or adjusted under 35 U.S.C. 154(b) by 0 days.

(21) Appl. No.: 08/918,598

(22) Filed: Aug. 23, 1997

(51) Int. Cl.[7] .............................................. H01L 21/311
(52) U.S. Cl. ........................ 438/700; 438/761; 438/778; 438/785
(58) Field of Search ................................ 438/700, 761, 438/778, 785

(56) References Cited

U.S. PATENT DOCUMENTS

| | | | |
|---|---|---|---|
| 4,759,823 A | * | 7/1988 | Asselanis et al. ......... 156/659.1 |
| 4,769,686 A | * | 9/1988 | Horiuchi et al. ........... 357/23.8 |
| 5,028,455 A | * | 7/1991 | Miller et al. .............. 427/126.3 |
| 5,242,534 A | * | 9/1993 | Bullington et al. ......... 156/634 |
| 5,338,951 A | * | 8/1994 | Argos, Jr. et al. .......... 257/295 |
| 5,443,688 A | * | 8/1995 | Toure et al. ................... 216/13 |

OTHER PUBLICATIONS

R.D. Jones "Hybrid Circuit Design and Manufacture", Marcek Dekker Inc, 1982, pp. 22–37, 1982.*
Jones, R.D. "Hybrid Circuit Desing and Manufacture", Marcel Dekker Inc., 1982 p. iii.*

* cited by examiner

Primary Examiner—Benjamin L. Utech
(74) Attorney, Agent, or Firm—Calvin B. Ward

(57) ABSTRACT

A method for constructing an electrode on a silicon substrate in which the electrode will be subjected to high temperatures during subsequent processing steps. A titanium oxide layer is deposited on the silicon substrate and annealed at a temperature higher than any subsequent temperature to which the titanium oxide layer will be subjected. The electrode is then deposited on the titanium oxide layer. The electrode is preferably platinum or a titanium/platinum composition. The platinum is also annealed to a temperature higher than any subsequent temperature to which the electrode will be subjected. In the preferred embodiment of the present invention, the electrode is constructed in a trench that is etched in a layer of metallic titanium that is deposited over the titanium oxide layer.

6 Claims, 3 Drawing Sheets

METHOD FOR CONSTRUCTING HEAT RESISTANT ELECTRODE STRUCTURES ON SILICON SUBSTRATES

FIELD OF THE INVENTION

The present invention relates to integrated circuits, and more particularly, to the construction of electrodes that must survive high temperature processing steps on silicon substrates.

BACKGROUND OF THE INVENTION

The present invention will be explained in the context of the construction of ferroelectric based capacitor-like structures; however, it will be apparent to those skilled in the art from the following discussion that the present invention may be applied to other integrated circuits. Ferroelectric based capacitors are in increasing demand as integrated circuit elements. Capacitors having lead lanthanum titanium zirconate (PLZT) dielectrics offer large dielectric constants which, in turn, make the construction of small capacitors with relatively large capacitances possible. A ferroelectric capacitor consists of a PLZT layer sandwiched between two planar electrodes. Capacitors utilizing platinum electrodes are particularly advantageous, since such capacitors provide a good crystallization platform with low leakage compared to capacitors utilizing other electrode materials.

Ferroelectric based field-effect transistors are also known to the art. These transistors have a structure which may be viewed as a capacitor in which the top electrode has been replaced by a semi-conductor layer having two separated contacts corresponding to the source and drain of the transistor. The bottom electrode and ferroelectric layer are constructed in essentially the same manner as the bottom electrode and ferroelectric layer of a ferroelectric capacitor.

An integrated circuit utilizing ferroelectric capacitor-like structures is typically constructed in two phases. First, the conventional CMOS circuits which connect to the ferroelectric devices are constructed in the silicon substrate. A protective layer of $SiO_2$ is then placed over the CMOS devices and the ferroelectric devices constructed on the protective layer or on a second protective layer deposited over the $SiO_2$ layer. The ferroelectric devices are connected to the underlying CMOS devices by etching vias in the protective layer.

The bottom electrode and ferroelectric layer of a ferroelectric structure are typically constructed by depositing a patterned bottom electrode on the protective layer and then covering the surface with the ferroelectric layer. The top electrodes are then deposited and the electrode/ferroelectric layer are stack etched back to the protective layer.

For example, U.S. Pat. No. 5,242,534 describes a construction method in which a titanium oxide layer is formed over the $SiO_2$ layer. A layer of titanium is deposited and the layer is masked and etched in those regions that are to become the bottom electrode leaving a trench in the titanium layer. The bottom electrode, typically platinum or a titanium/platinum stack, is then deposited in the trench. The mask is then removed and the exposed titanium is oxidized. This leaves the regions between the bottom electrodes covered with titanium oxide and the bottom electrode recessed in the titanium oxide layer. The PZT dielectric layer is then deposited over the wafer. The top electrodes are typically deposited as a uniform layer. The top electrodes and dielectric layer are then stack etched back to the titanium oxide layer in the regions between the capacitor-like structures.

The process described above subjects the bottom electrode structure to high temperatures during the annealing of the platinum structure and the subsequent sintering of the ferroelectric layer. The sintering of the ferroelectric layer typically involves subjecting the electrode structure to temperatures in excess of 650° C. These high temperature steps stress the bottom electrode/substrate attachment and lead to the bottom electrode being deformed or separated from the underlying substrate, thereby rendering the capacitor useless because of roughness, voids, hillocks (spikes).

Broadly, it is the object of the present invention to provide an improved method for constructing electrodes.

These and other objects of the present invention will become apparent to those skilled in the art from the following detailed description of the invention and the accompanying drawings.

SUMMARY OF THE INVENTION

The present invention is a method for constructing an electrode on a silicon substrate in which the electrode will be subjected to high temperatures during subsequent processing steps. A titanium oxide layer is deposited on the silicon substrate and annealed at a temperature higher than any subsequent temperature to which the titanium oxide layer will be subjected. The electrode is then deposited on the titanium oxide layer. The electrode is preferably platinum or a titanium/platinum composition. The platinum is also annealed to a temperature higher than any subsequent temperature to which the electrode will be subjected. In the preferred embodiment of the present invention, the electrode is constructed in a trench that is etched in a layer of metallic titanium that is deposited over the titanium oxide layer.

DETAILED DESCRIPTION OF THE INVENTION

Figure 1:
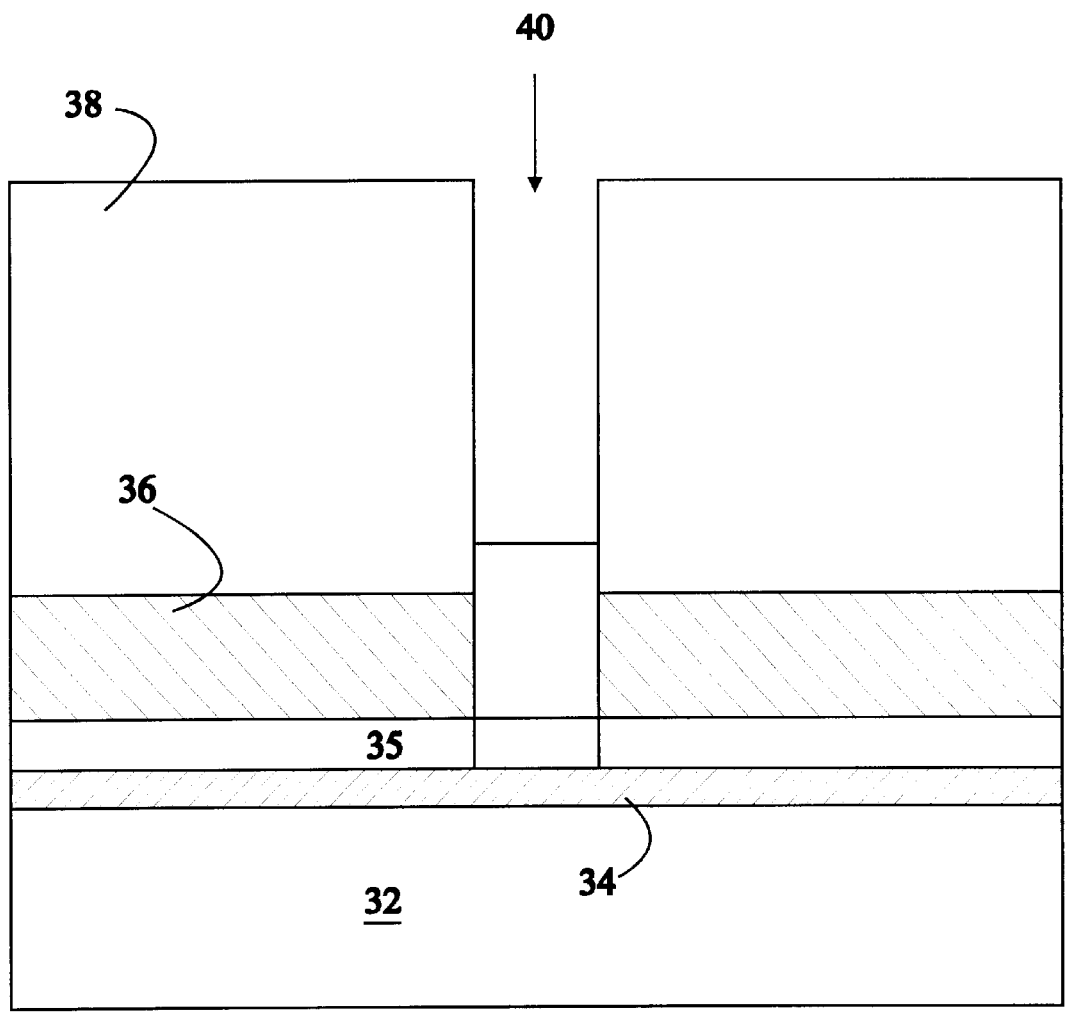
FIGS. 1, 2, 3, and 4 are cross-sectional views showing the various stages in the construction of a bottom electrode according to the present invention on a silicon substrate.
Figure 2:
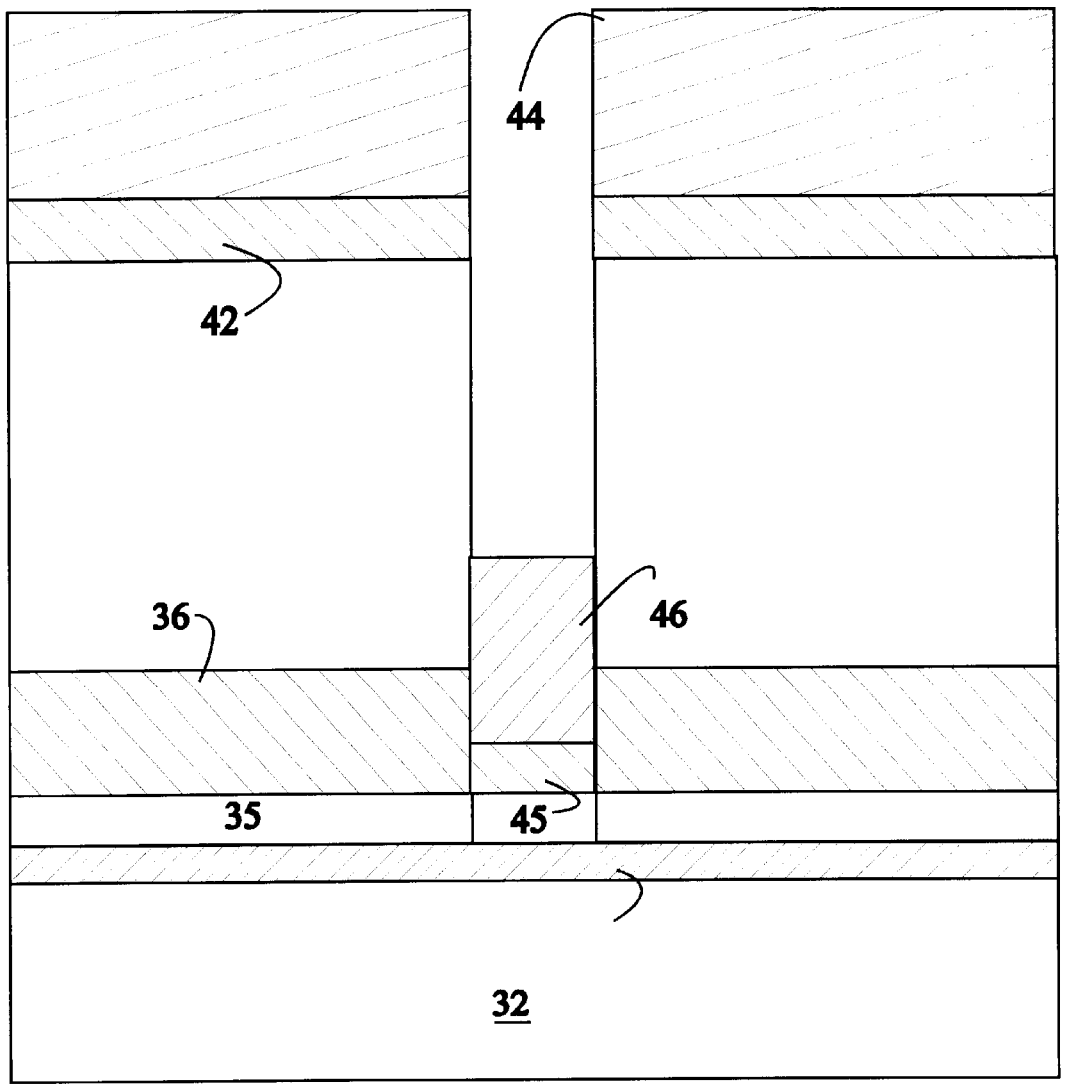
Figure 3:
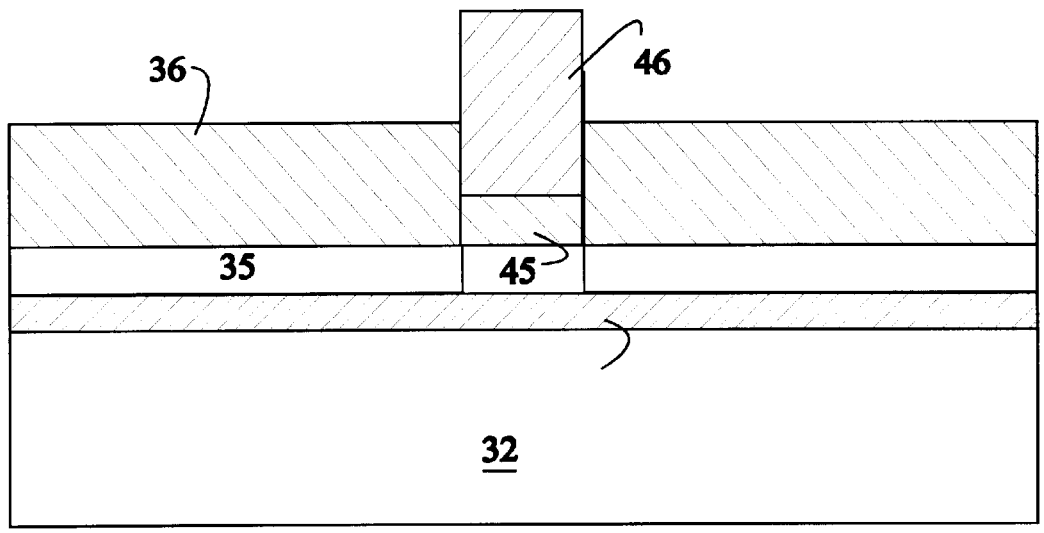

The manner in which the present invention achieves its advantages may be more easily understood with reference to FIGS. 1–3 which illustrate the deposition of an electrode according to the method of the present invention.

The deposition process is begun, as shown in FIG. 1, by depositing an $SiO_2$ layer 34 on a silicon substrate 32. A titanium oxide layer 35 is then deposited on the $SiO_2$ layer. The titanium oxide layer provides two benefits. First, layer 35 acts as an etch stop for defining the end-point of a subsequent etching process. Second, layer 35 prevents contact between materials connected to the stack electrode and the underlying $SiO_2$. Such contact can cause component failure in the case of PZT dielectric layers that are deposited on top of the finished electrode.

The titanium oxide layer is then annealed at a temperature which is at least as high if not higher than any temperature to which the layer will be subjected in subsequent processing steps. In general, the highest processing temperature is that needed to sinter the ferroelectric dielectric layer which is deposited over the bottom electrode. This layer is typically sintered at a temperature of at least 650° C. In the preferred embodiment of the present invention, an anneal temperature of 850° C. is utilized. This annealing step provides very high densification of the titanium dioxide, making it very stable at high temperatures. In addition, the annealing step improves adhesion of the titanium oxide to the underlying substrate, and hence, protects against the type of bottom electrode failure discussed above.

A titanium layer 36 having a thickness of approximately 200 Å is then deposited on titanium oxide layer 35 and a patterned layer 38 of photoresist is deposited on titanium layer 36. The titanium layer is then preferably dry etched using a $CF_4$ plasma. Other etching methods known in the art may also be used. For example, a wet etching solution of water, HCl, and buffered oxide etchant in the ratios of 3:1:1 is also suitable for the present invention. The buffered oxide etchant is a dilute HF solution which is commercially available and common in the art. The etching is sufficient to remove the titanium layer in areas that are not protected by the photoresist layer. An exemplary location is shown at 40. The etching is preferably stopped by the titanium oxide layer 35 discussed above.

The etching operation provides two benefits. First, it removes any residue generated by the deposition of the photoresist. Second, the subsequently deposited electrode layers are counter sunk into layer 36 which reduces the step height of the finished electrode.

Referring to FIG. 2, after the etching operation is completed, an approximately 50 Å layer 42 of titanium is deposited. This generates a titanium base layer 45 which will "glue" the subsequently deposited platinum to the titanium oxide layer. As noted above, the etching operation has removed any residue resulting from the photoresist deposition; hence, the titanium is firmly bound to the titanium oxide surface. The "glue" layer is not limited to titanium. Any material that will bond the platinum to the substrate with sufficient force to resist separation of the platinum from the substrate during subsequent processing steps may be utilized, provided the material may be etched. For example, gold is also found to act as a sufficient glue material for purposes of the present invention.

Figure 4:
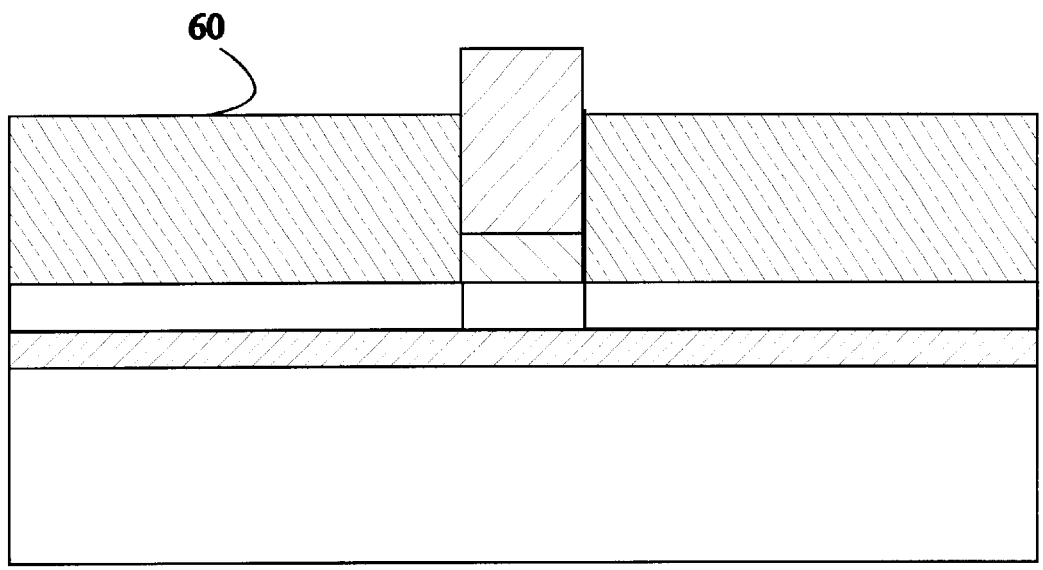

An approximately 1500 Å layer 44 of platinum is then deposited, and the photoresist is removed leaving the electrode stack in its final configuration as shown in FIG. 3. The bottom electrode structure is then preferably annealed at a temperature above the highest temperature to which the electrode will be subjected in subsequent processing steps in an oxygen atmosphere. The anneal temperature, however, must be below that at which the titanium dioxide layer was annealed in the annealing step discussed above. This annealing step increases the bonding between the bottom electrode and the underlying titanium oxide layer. In addition, it improves the grain size of the platinum in the electrode. Finally, the anneal converts the metallic titanium layer 36 to titanium oxide, leaving the top electrode in a field of titanium oxide as shown in FIG. 4.

The ferroelectric dielectric layer may then be deposited on the electrode and titanium oxide field and annealed. Since these steps are well known to those skilled in the art, they will not be discussed in further detail here.

While the above described embodiments of the present invention have utilized an electrode having a titanium "glue" layer between the platinum and titanium oxide layers, embodiments which do not utilize this glue layer are also functional. The glue layer is needed in embodiments which utilize a "lift-off" process for patterning the platinum layer. In these embodiments, the photoresist layer is removed before the platinum electrode is annealed. Prior to annealing, the platinum layer's attachment to the underlying substrate is too weak to resist the stress of removing the layer of photoresist. Hence the added glue layer is needed. If the platinum is patterned after annealing, the glue layer is not needed. In fact, in this case, it is advantageous to eliminate the glue layer, as the titanium interacts with the platinum in a manner which increases the roughness of the electrode.

The above described embodiments of the present invention have utilized a titanium oxide layer to separate the platinum electrode from the underlying circuitry. However, it will be apparent to those skilled in the art from the above discussion that other materials may be used for this protective layer. For example, zirconium oxide may be utilized in place of the titanium oxide layer described above.

Various modifications to the present invention will become apparent to those skilled in the art from the foregoing description and accompanying drawings. Accordingly, the present invention is to be limited solely by the scope of the following claims.

What is claimed is:

1. A method for constructing an electrode on a silicon substrate, said electrode underlying a dielectric layer, said method comprising the steps of:

depositing an oxide layer on said silicon substrate;

annealing said oxide layer at a first temperature;

depositing said electrode on said oxide layer;

depositing said dielectric layer and heating said dielectric layer to a second temperature, said first temperature being greater than said second temperature.

2. The method of claim 1 wherein said step of depositing said electrode comprises depositing a layer of platinum and annealing said layer of platinum at a temperature higher than said second temperature but less than said first temperature.

3. The method of claim 1 wherein said step of depositing said electrode comprises the steps of:

depositing a layer of metallic titanium on said silicon substrate;

etching a trench in said layer of metallic titanium;

depositing a layer of titanium in said trench;

depositing a layer of platinum in said trench; and annealing said layer of platinum at a temperature higher than said second temperature but less than said first temperature.

4. The method of claim 1 wherein said oxide layer comprises titanium oxide.

5. The method of claim 1 wherein said oxide layer comprises zirconium oxide.

6. The method of claim 1 wherein said second temperature is greater than 650° C.

* * * * *